(12) United States Patent
Orita et al.

(10) Patent No.: US 7,420,610 B2
(45) Date of Patent: Sep. 2, 2008

(54) SOLID-STATE IMAGING ELEMENT, SOLID-STATE IMAGING DEVICE, AND METHOD FOR FABRICATING THE SAME

(75) Inventors: Kenji Orita, Takatsuki (JP); Shinichi Takigawa, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 674 days.

(21) Appl. No.: 11/011,042

(22) Filed: Dec. 15, 2004

(65) Prior Publication Data

US 2006/0125948 A1    Jun. 15, 2006

(51) Int. Cl.
- H04N 5/225 (2006.01)
- H04N 3/14 (2006.01)
- H04N 5/335 (2006.01)
- H04N 9/04 (2006.01)
- H04N 9/083 (2006.01)

(52) U.S. Cl. .............. 348/340; 348/374; 348/273; 348/279; 348/280; 348/276

(58) Field of Classification Search ............. 348/340, 348/335, 336; 257/431
See application file for complete search history.

(56) References Cited

U.S. PATENT DOCUMENTS

| | | | |
|---|---|---|---|
| 5,633,527 A * | 5/1997 | Lear | 257/432 |
| 6,147,390 A * | 11/2000 | Nakano et al. | 257/437 |
| 6,188,094 B1 * | 2/2001 | Kochi et al. | 257/232 |
| 6,211,916 B1 * | 4/2001 | Hawkins et al. | 348/340 |
| 6,583,438 B1 * | 6/2003 | Uchida | 257/59 |
| 6,605,850 B1 * | 8/2003 | Kochi et al. | 257/431 |
| 6,656,761 B2 * | 12/2003 | Csutak et al. | 438/57 |
| 6,665,014 B1 * | 12/2003 | Assadi et al. | 348/340 |
| 7,075,164 B2 * | 7/2006 | Uya | 257/431 |
| 7,136,217 B2 * | 11/2006 | Kawakami et al. | 359/321 |
| 7,245,324 B2 * | 7/2007 | Namazue et al. | 348/340 |
| 7,265,432 B2 * | 9/2007 | Takao | 257/448 |

(Continued)

FOREIGN PATENT DOCUMENTS

EP    0744778    *    9/1995

(Continued)

OTHER PUBLICATIONS

List, W.F., "Solid-State Imaging—Methods of Approach," Apr. 1968, IEEE Transactions on Electron Devices, vol. 15, pp. 256-261.*

(Continued)

*Primary Examiner*—Ngoc-Yen T. Vu
*Assistant Examiner*—Michael Osinski
(74) *Attorney, Agent, or Firm*—Wenderoth, Lind & Ponack, L.L.P.

(57) ABSTRACT

A solid state-imaging element including photoelectric conversion element and an optical element such as a photonic crystal is disclosed. The optical element is formed on the photoelectric conversion element, and has a refractive index periodic structure made up of stacked layers of materials with different refractive indices. The refractive index periodic structure is defined by multiple layers along a stacking direction and by a group of concentric similar shapes along an in-plane direction. The optical element may be fabricated via lithography and etching, or an autocloning technique. A solid state-imaging device including an arrangement of several solid-state imaging elements is also disclosed.

7 Claims, 11 Drawing Sheets

U.S. PATENT DOCUMENTS

2005/0122417 A1 * 6/2005 Suzuki ....................... 348/340

FOREIGN PATENT DOCUMENTS

| | | | |
|---|---|---|---|
| EP | 1045449 | * | 4/2000 |
| JP | 2001-44401 | | 2/2001 |
| JP | 2003-133536 | | 5/2003 |

OTHER PUBLICATIONS

Abdallah, S., "A General Overview of Solid State Imaging Sensors Types," Third Workshop on Photonics and Its Application at Egyptian Engineering Faculties and Institutes, 2002, pp. 1-10 □□.*

Stancampiano, C.V., "Solid-State Image Sensors," Sep. 1995, Proceedings of the Eighth Annual IEEE International ASIC Conference and Exhibit, pp. 395-402.*

* cited by examiner

| | Material | Refractive index | Film thickness in periodic structure | Film thickness of "stacking-fault" resonator |
|---|---|---|---|---|
| Low refractive material | SiO2 | 1.5 | 217nm | |
| | Al2O3 | 1.7 | 191nm | |
| High refractive material | TiO2 | 2.4 | 135nm | 270nm |
| | Ta2O5 | 2.3 | 141nm | 282nm |
| | Nb2O5 | 2.2 | 147nm | 294nm |
| | HfO2 | 2.0 | 162nm | 324nm |

| (1, 2, 3 from the inside) | | Example 1 | | Example 2 | | Example 3 | |
|---|---|---|---|---|---|---|---|
| | | Pitch | Width | Pitch | Width | Pitch | Width |
| P1, A1 | | 600nm | 50nm | 600nm | 50nm | 600nm | 50nm |
| P2, A2 | | 600nm | 100nm | 300nm | 50nm | 420nm | 70nm |
| P3, A3 | | 600nm | 150nm | 200nm | 50nm | 400nm | 100nm |

FIG. 12

SOLID-STATE IMAGING ELEMENT, SOLID-STATE IMAGING DEVICE, AND METHOD FOR FABRICATING THE SAME

BACKGROUND OF THE INVENTION (1) Field of the Invention

The present invention relates to a solid-state imaging element having a photoelectric conversion element which is formed on a semiconductor substrate and an optical element which is formed on the photoelectric conversion element, and particularly to a solid-state imaging element that uses a photonic crystal as the optical element, and to a solid-state imaging device including a plurality of the solid-state imaging elements.

(2) Description of the Related Art

Figure 1A:
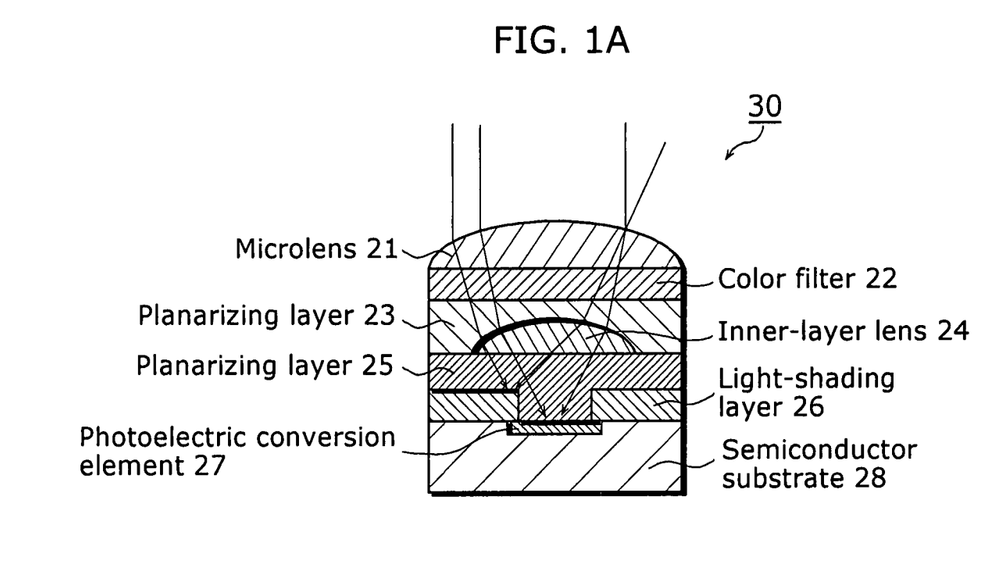
FIG. 1A is a cross-sectional view of a solid-state imaging element in a conventional technology.
Figure 1B:
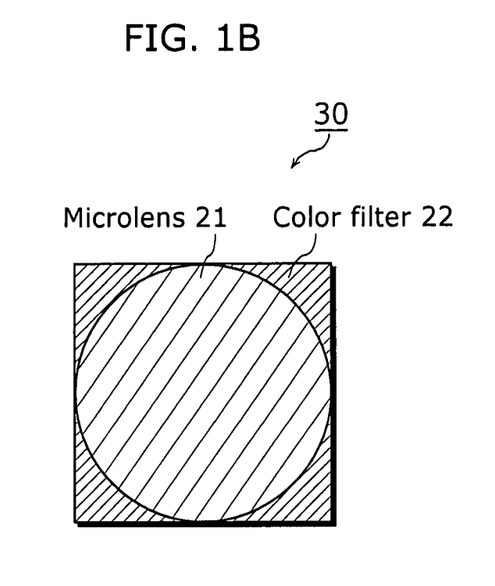
FIG. 1B is a top view of a solid-state imaging element in the conventional technology.

Conventionally, a variety of techniques for enhancing light condensing efficiency of solid-state imaging elements have been suggested. For example, the solid-state imaging element 30 shown in FIG. 1 not only has a microlens 21 formed on the top of the imaging element 30, but also an inner-layer lens 24 formed inside the imaging element 30 for condensing incident light into a photoelectric conversion element 27, in order to improve light condensing. In addition, the solid-state imaging element 30 is equipped with a color filter 22 for detecting a red, green or blue (RGB) light color signal. In other words, one of three types of color filters is selected for the solid-state imaging element 30 depending upon a color signal to be detected.

In addition, other various techniques concerning solid-state imaging elements (or solid-state imaging devices) have been suggested (See, for example, Japanese Laid-Open Patent Application Publication No. 2003-133536 ("the '536 Publication") and Japanese Laid-Open Patent Application Publication No. 2001-44401 ("the '401 Publication")).

The solid-state imaging device disclosed in the '536 Publication has a structure for shading light of a predetermined wavelength range from a region surrounding a window on a photoelectric converter by providing in that region a photonic crystal having a waveguide structure. Therefore, this solid-state imaging device allows efficient light condensing while preventing the light from being incident to the peripheral region of the photoelectric converter, without using a shading layer made of metal or the like.

Furthermore, in the solid-state image pickup element disclosed in the '401 Publication, a tapered reflection film having a light reflecting characteristic is formed on a photoelectric conversion part. Transparent films, whose refractive indices are higher in the center than in the vicinity of the photoelectric conversion part, are formed on the photoelectric conversion part which is surrounded by the reflection film. As a result, the light incident to the solid-state image pickup element is condensed efficiently to the photoelectric conversion part and, thus, the light condensing is improved.

However, the above-mentioned solid-state imaging elements (or solid-state imaging devices) use a plurality of elements for light condensing and color separation, so it is impossible to enhance light condensing beyond certain limits due to reflection loss and coupling loss between respective elements. This problem presents an obstacle when miniaturizing a solid-state imaging element for increasing the number of pixels in every unit area.

There is another problem with the above-mentioned solid-state imaging elements. Since a color filter has to be provided separately, and the resins and pigments that make up the color filter are mere fractions of the size of the solid-state imaging element, color separation becomes more difficult as the solid-state imaging element becomes smaller.

There is still another problem. In a solid-state imaging device that includes a set of the solid-state imaging elements 30, light is incident almost perpendicularly upon the solid-state imaging elements 30 located around the center of the device, whereas it is incident obliquely upon the solid-state imaging elements 30 located on the periphery of the device. However, it is difficult to form the microlens 21 for the solid-state imaging elements 30 around the center of the device separately from the microlens 21 for the elements 30 on the periphery thereof (namely, to control the forming of each microlens 21 in consideration of the position of each solid-state imaging element 30 in the device) because the microlens 21 is formed by reflow process; thus, the light condensing on the periphery of the solid-state imaging device is lower than that in the center thereof.

Furthermore, since the solid-state imaging device as disclosed in the '536 Publication employs a method of obtaining each of RGB color signals of the light using a mirror, it is difficult to enhance light condensing beyond certain limits.

SUMMARY OF THE INVENTION

An object of the present invention, in view of the above problems, is to provide a miniature solid-state imaging element with low loss and efficient light condensing, a solid-state imaging device including such solid-state imaging elements, and a method for fabricating them.

In order to achieve the above-mentioned objectives, the solid-state imaging element according to the present invention has a photoelectric conversion element and an optical element which is formed on the photoelectric conversion element, wherein the optical element has a refractive index periodic structure for a predetermined refractive index, the refractive index periodic structure being made up of at least two types of light-transparent materials with different refractive indices which are stacked in layers, and the refractive index periodic structure has a periodic structure along a stacking direction of multiple layers and a periodic structure along an in-plane direction of concentric similar shapes.

As described above, since the solid-state imaging element according to the present invention allows a single-piece optical element having a refractive index periodic structure to realize color separation and light condensing at the same time, it solves reflection loss and coupling loss caused by use of multiple elements. As a result, a miniature solid-state imaging element with extremely low loss and efficient light condensing can be realized.

In addition, the solid-state imaging device according to the present invention comprises a plurality of solid-state imaging elements which are arranged in a two-dimensional plane, wherein each of the solid-state imaging elements has a photoelectric conversion element and an optical element which is formed on the photoelectric conversion element, the optical element has a refractive index periodic structure for a predetermined refractive index, the refractive index periodic structure being made up of at least two types of light-transparent materials with different refractive indices which are stacked in layers, and the refractive index periodic structure has a periodic structure along a stacking direction of multiple layers and a periodic structure along an in-plane direction of concentric similar shapes.

As described above, since the solid-state imaging device includes a plurality of solid-state imaging elements which are arranged in a two-dimensional plane, it is also possible to realize a solid-state imaging device with low loss and efficient light condensing as a whole.

Since one method of the present invention involves using a multi-layer forming technique used for fabricating semiconductors (such as lithography and etching) to form the tubular optical element (photonic crystal) having a refractive index periodic structure, it is possible to easily realize the refractive index periodic structure for detecting one of the RGB color signals or the optimum refractive index periodic structure dependent upon the position of the solid-state imaging element in the device.

There is another method for fabricating the solid-state imaging device of the present invention. To be more specific, autocloning is used for forming, on a base having concentric similar shapes in the in-plane direction, an optical element (photonic crystal) having a refractive index periodic structure with the vertical sectional profile being a series of triangles. This optical element (photonic crystal) with the triangular vertical sectional profile has the same function as the tubular optical element (photonic crystal).

As mentioned above, the solid-state imaging device of the present invention realizes not only low loss and efficient light condensing, but also miniaturization of the device. Therefore, this solid-state imaging device is applicable in a wide variety of areas, and thus the practical value thereof is extremely high.

As further information about technical background to this application, the disclosure of Japanese Patent Application No. 2003-192175 filed on Jul. 4, 2003 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DETAILED DESCRIPTION OF THE INVENTION

The embodiments of the present invention will be explained below with reference to the drawings.

First Embodiment

Figure 2:
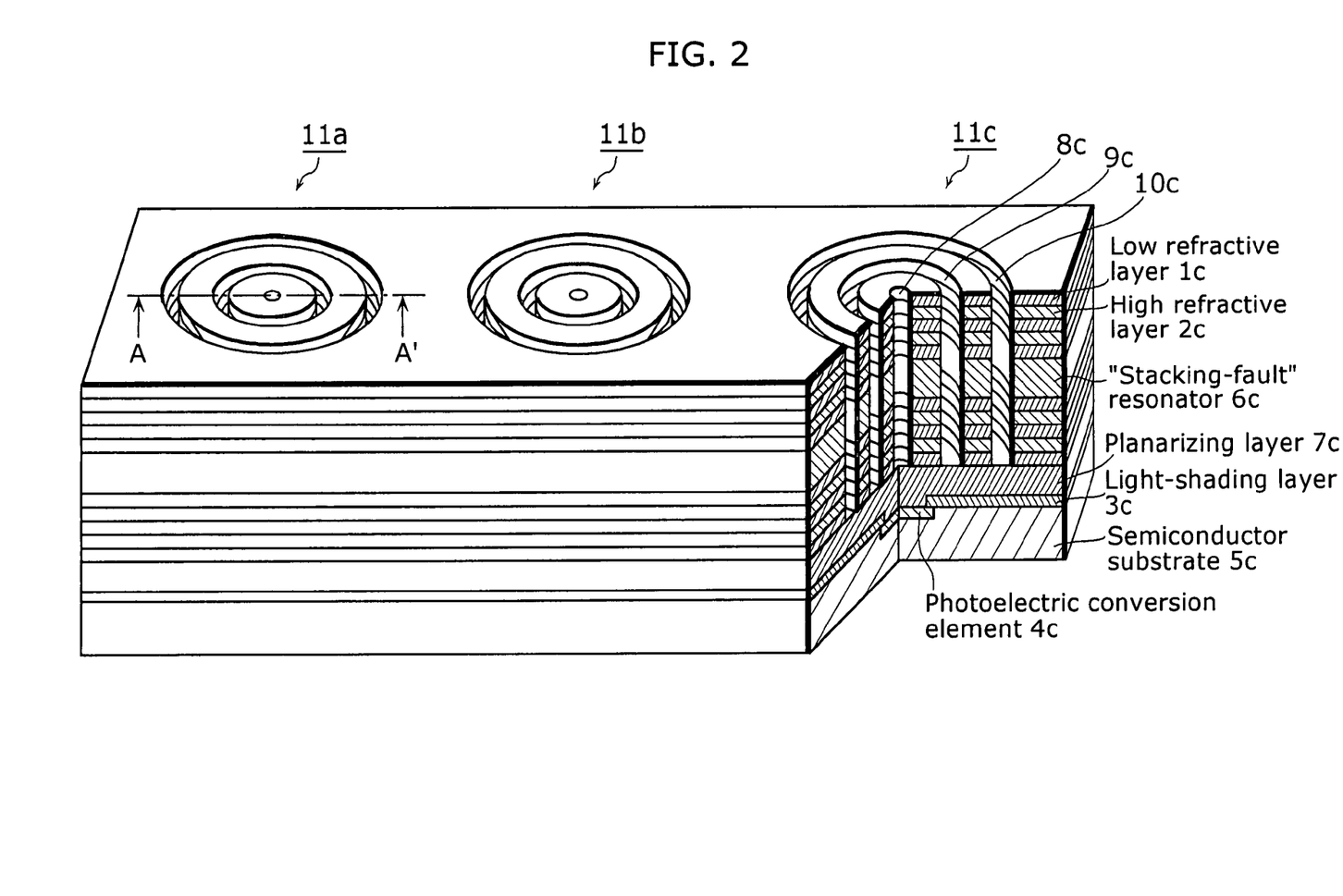
FIG. 2 is an external view of a set of solid-state imaging elements in a first embodiment of the present invention.

FIG. 2 is an external view of solid-state imaging elements 11a, 11b and 11c in the present embodiment. For example, the structure of the solid-state imaging element 11c is as follows: a photoelectric conversion element 4c for converting incident light into signal charge is provided on the surface of a semiconductor substrate 5c; a light-shading layer 3c for cutting off the incident light from the side is provided along the side of the window upon the photoelectric conversion element 4c; a planarizing layer 7c is provided over the light-shading layer 3c and the photoelectric conversion element 4c; and a photonic crystal having a multi-layer structure to be described later, as an optical element, is provided on the planarizing layer 7. As shown in FIG. 2, the photonic crystal of the solid-state imaging element 11c includes a central cavity 8c and two doughnut-shaped longitudinal cavities 9c and 10c around the central cavity 8c. In other words, five concentric circles can be seen on the top of the solid-state imaging element 11c, and it is formed so that the center of these concentric circles is aligned with the center of the photoelectric conversion element 4c.

The photonic crystal is used for making color separation of the incident light and the light condensing all at once. It has a periodic structure of refractive indices in the stacking direction, like a multi-layer filter. To be more specific, the photonic crystal has an 11-layer structure as a whole. It includes low refractive layers 1 made of low refractive material (1c in the solid-state imaging element 11c, for example) as the odd-numbered layers including the top layer and high refractive layers 2 made of high refractive material (2c in the solid-state imaging element 11c, for example) as the even-numbered layers including the second layer from the top, which are stacked alternately. Note that the sixth layer from the top, which is made of the high refractive material, is a "stacking-fault" resonator (6c in the solid-state imaging element 11c, for example).

As materials for a photonic crystal, for example, $SiO_2$, $Al_2O_3$ or the like can be used as a low refractive material and $TiO_2$, $Ta_2O_5$ or the like can be used as a high refractive material. Note that it is desirable that these materials are transparent in the visible region to avoid absorption loss. When $SiO_2$ and $Ta_2O_5$ are used, the $SiO_2$ film thickness is 217 nm, whereas the $Ta_2O_5$ film thickness is 141 nm (where the thickness of the "stacking-fault" resonator is 282 nm).

In the in-plane direction of the photonic crystal, three cavities are provided concentrically for one solid-state imaging element. In other words, a central opening and two doughnut-shaped openings on the top layer penetrate the photonic crystal vertically down to the bottom layer. Both the diameters of the central openings and the widths of the doughnut-shaped openings of the photonic crystals are 180 nm for the solid-state imaging element 11a, 210 nm for 11b, and 250 nm for 11c, (where the pitch between all the doughnut-shaped openings 600 nm).

The transmission wavelength of the photonic crystal is determined by the thicknesses and the refractive indices of the low refractive layers 1 and the high refractive layers 2 in the stacking direction. Various periods of concentric openings cause various effective refractive indices and, thus, cause the transmission wavelengths to vary from element to element. As a result, the photonic crystals with various transmission wavelengths in the solid-state imaging elements 11a, 11b and 11c allow, as a whole, separation of incident light into RGB colors (wavelength filtering function). In addition, the in-plane directional periodic structure of refractive index of this photonic crystal brings about a light condensing function.

Note that the structures of the solid-state imaging elements 11a, 11b and 11c are not limited to those mentioned above.

Figure 3:
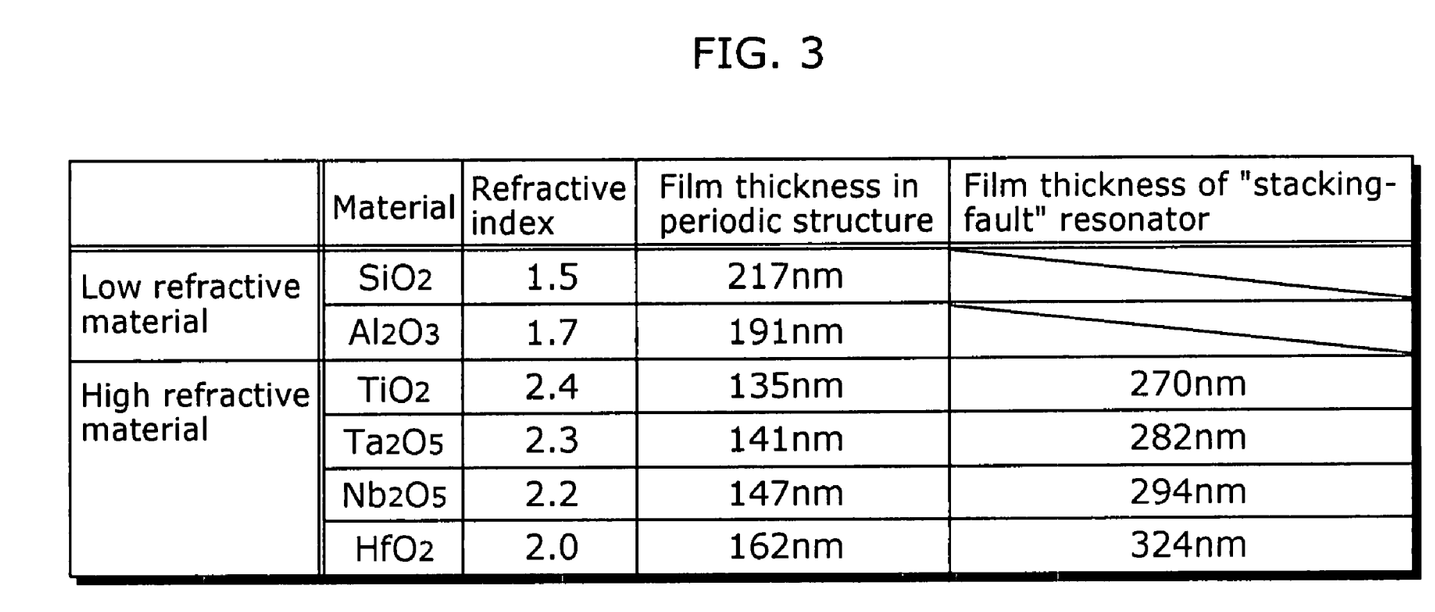
FIG. 3 is a table showing examples of low refractive materials and high refractive materials that make up a low refractive layer and a high refractive layer of a solid-state imaging element in the first embodiment of the present invention.

FIG. 3 is a table showing examples of low refractive materials and high refractive materials that make up the solid-state imaging element in the present embodiment. FIG. 3 also shows examples of film thicknesses of the "stacking-fault" resonator 6c.

Figure 4:
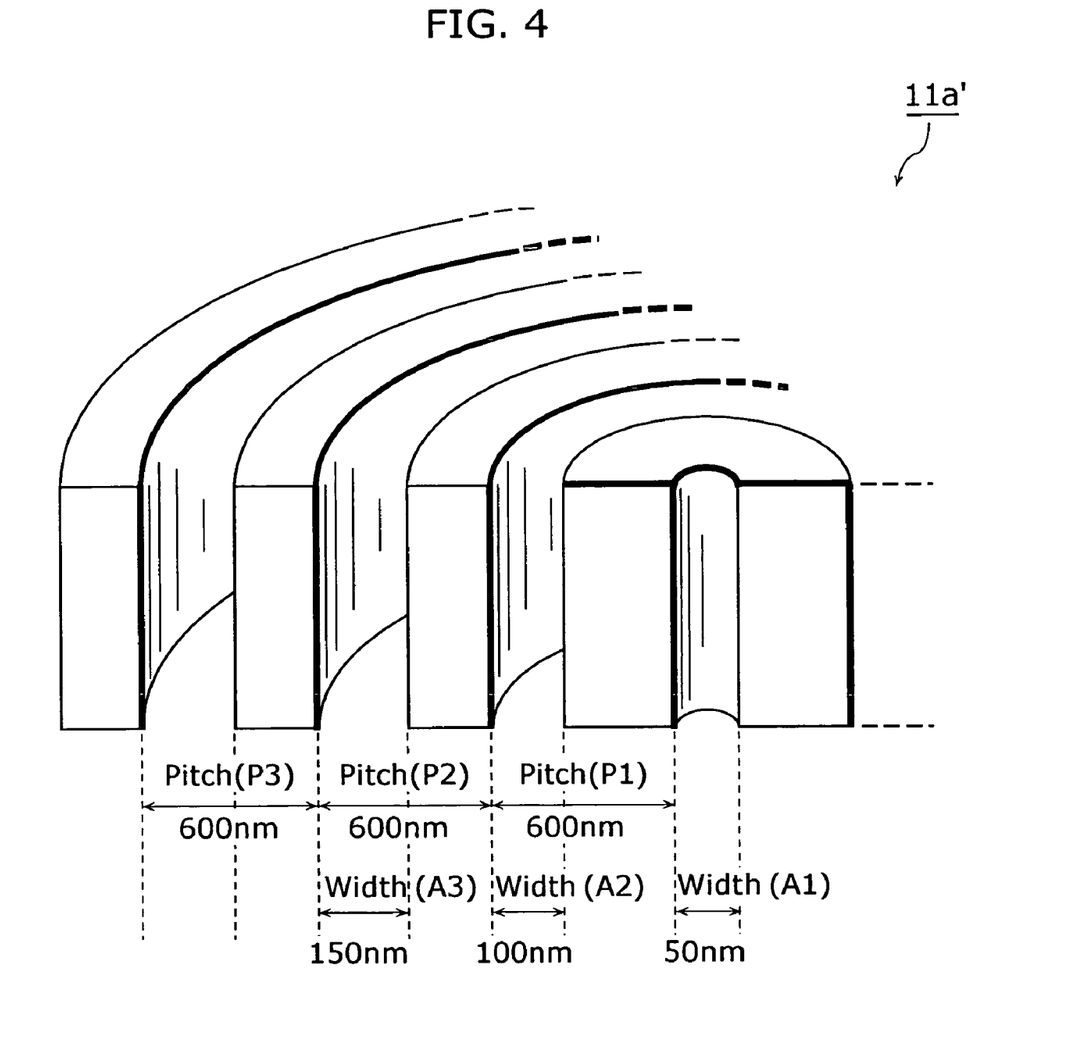
FIG. 4 is a diagram for illustrating pitches and openings in a photonic crystal of a solid-state imaging element in the first embodiment of the present invention.

FIG. 4 is a diagram illustrating pitches and openings in the photonic crystal of the solid-state imaging element in the present embodiment. FIG. 2 shows the solid-state imaging element having 3 openings, whereas FIG. 4 shows a solid-state imaging element 11a' having 4 openings. Referring to FIG. 4, a pitch is defined as a distance between adjacent openings. For example, the distance from the edge of the central opening to the outer edge of the adjacent doughnut-shaped opening is defined as a pitch P1. Pitches P2 and P3 are defined in the same manner. Furthermore, in FIG. 4, the width (diameter) of the central opening is defined as A1, and the widths of the smaller doughnut-shaped opening and the larger doughnut-shaped opening are defined as A2 and A3, respectively.

Figure 5:
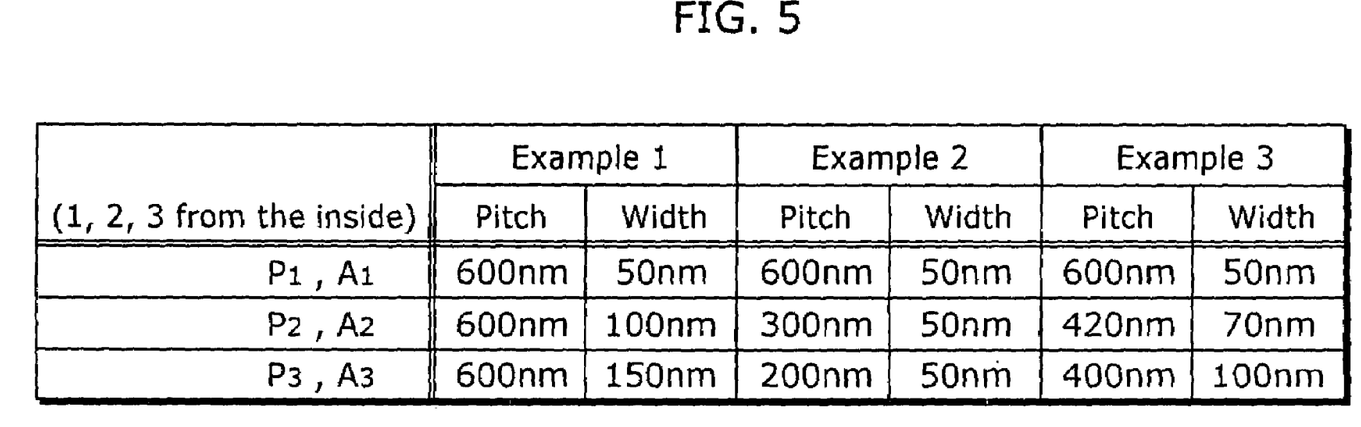
FIG. 5 is a table showing examples of pitches and widths of openings in a solid-state imaging element in the first embodiment of the present invention.

FIG. 5 is a table showing examples of pitches and widths of openings in the solid-state imaging element as defined as above.

Figure 6:
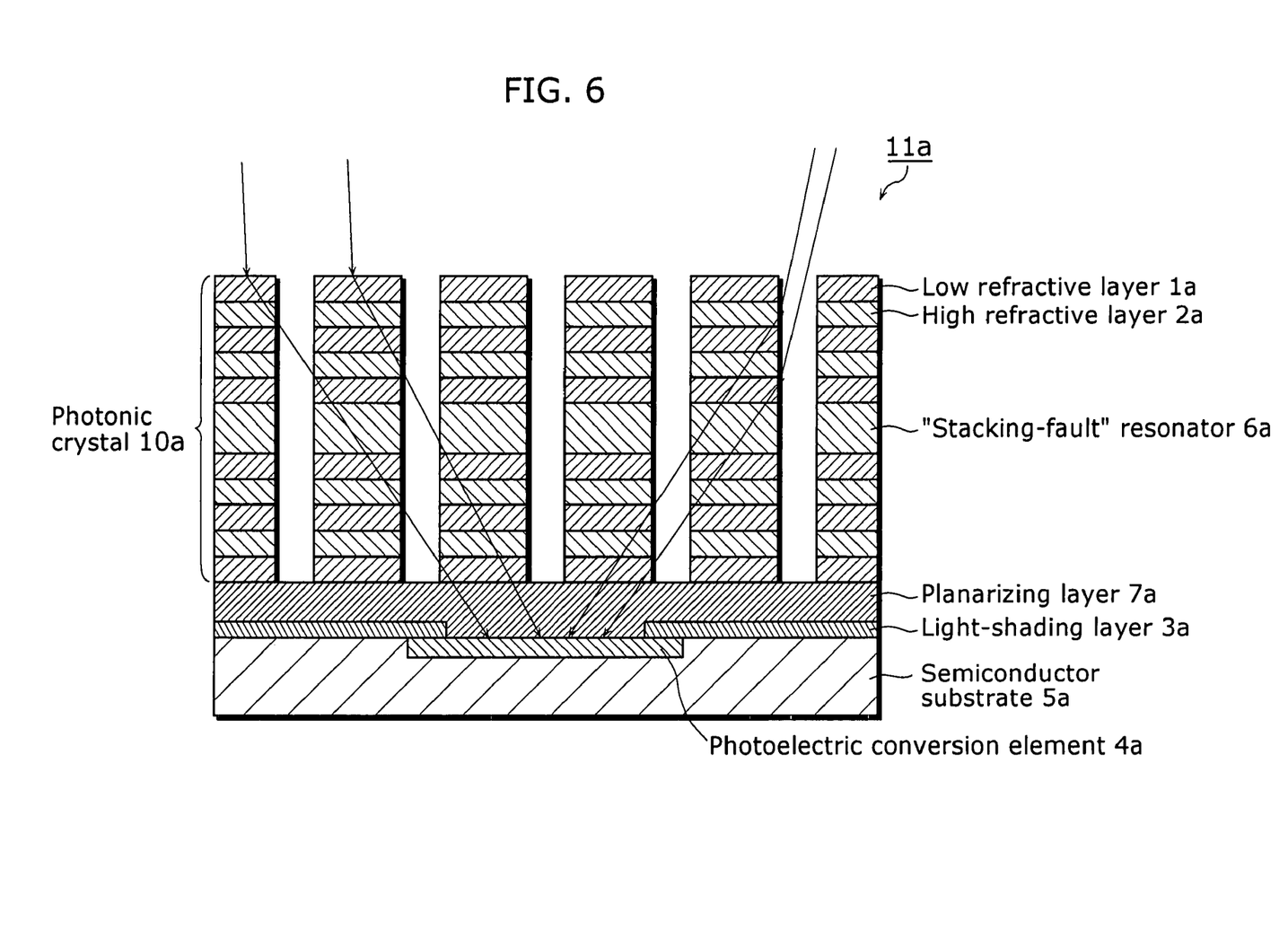
FIG. 6 is a diagram showing an example of a cross-sectional view of a solid-state imaging element in the first embodiment of the present invention.

FIG. 6 is a diagram showing an example of a cross-sectional view of the solid-state imaging element 11a in the present embodiment. Due to the periodic structure of refractive indices in the stacking direction and the periodic structure of refraction indices in the in-plane direction (concentric circular structure, for example) of the photonic crystal 10a, only incident light of a particular wavelength range (red light in this example) is transmitted and condensed, and hits the photoelectric conversion element 4a.

Figure 7A:
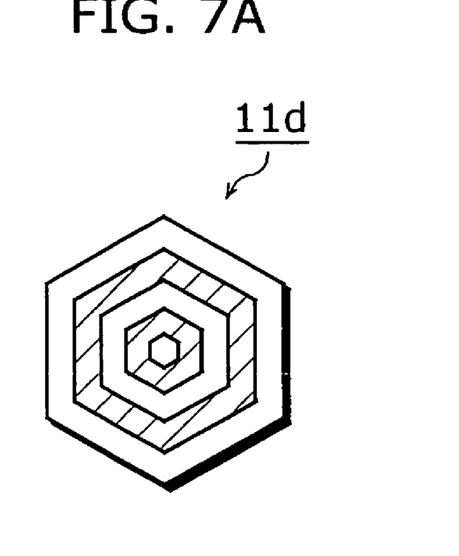
FIG. 7A is a diagram showing a modification of a solid-state imaging element in the first embodiment of the present invention, in which the in-plane directional periodic structure is regular hexagonal in shape.
Figure 7B:
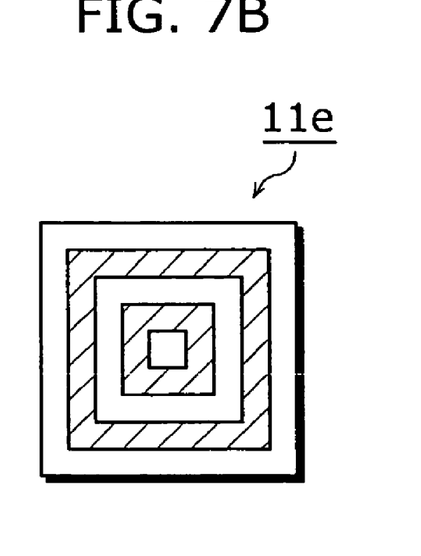
FIG. 7B is a diagram showing a modification of a solid-state imaging element in the first embodiment of the present invention, in which the in-plane directional periodic structure is square in shape.

FIG. 7A and FIG. 7B are diagrams showing modifications of the solid-state imaging element in the present embodiment. FIG. 2 shows the solid-state imaging element having a concentric circular pattern in the in-plane direction (namely, in the horizontal sectional view thereof), whereas FIG. 7A shows a solid-state imaging element 11d having a concentric regular hexagonal pattern, and FIG. 7B shows a solid-state imaging element 11e having a concentric square pattern.

Figure 8:
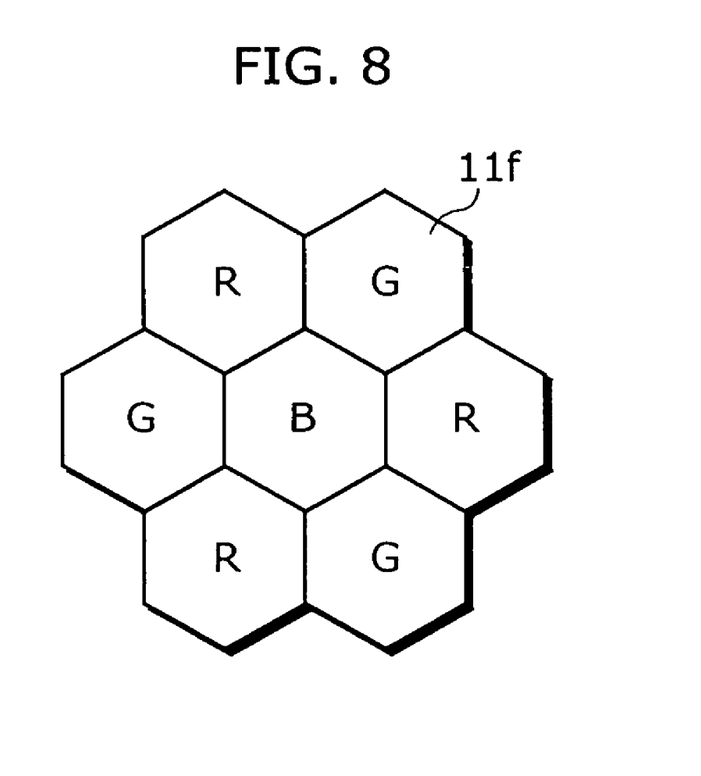
FIG. 8 is a diagram showing an example of a two-dimensional arrangement of solid-state imaging elements having a regular hexagonal periodic structure in the in-plane direction in the first embodiment of the present invention.

FIG. 8 is a diagram showing an example of a two-dimensional arrangement of solid-state imaging elements 11f having a concentric regular hexagonal pattern in the in-plane direction in the present embodiment. In this example, three types of solid-state imaging elements 11f of regular hexagonal patterns, which allow transmission of any one of RGB components of incident light, are arranged with no space between each other so that the same type of elements are not adjacent to each other. Compared with a grid arrangement of the solid-state imaging elements 11f, a honeycomb arrangement like this reduces the regions like the corners of the photonic crystal in each element that cannot condense the light. Therefore, the light condensing is improved. Furthermore, a honeycomb arrangement of the solid-state imaging elements 11f having photonic crystals of a concentric regular hexagonal pattern in the in-plane direction hardly produces the regions that cannot condense the light. Therefore, the light condensing is even more enhanced.

Figure 9:
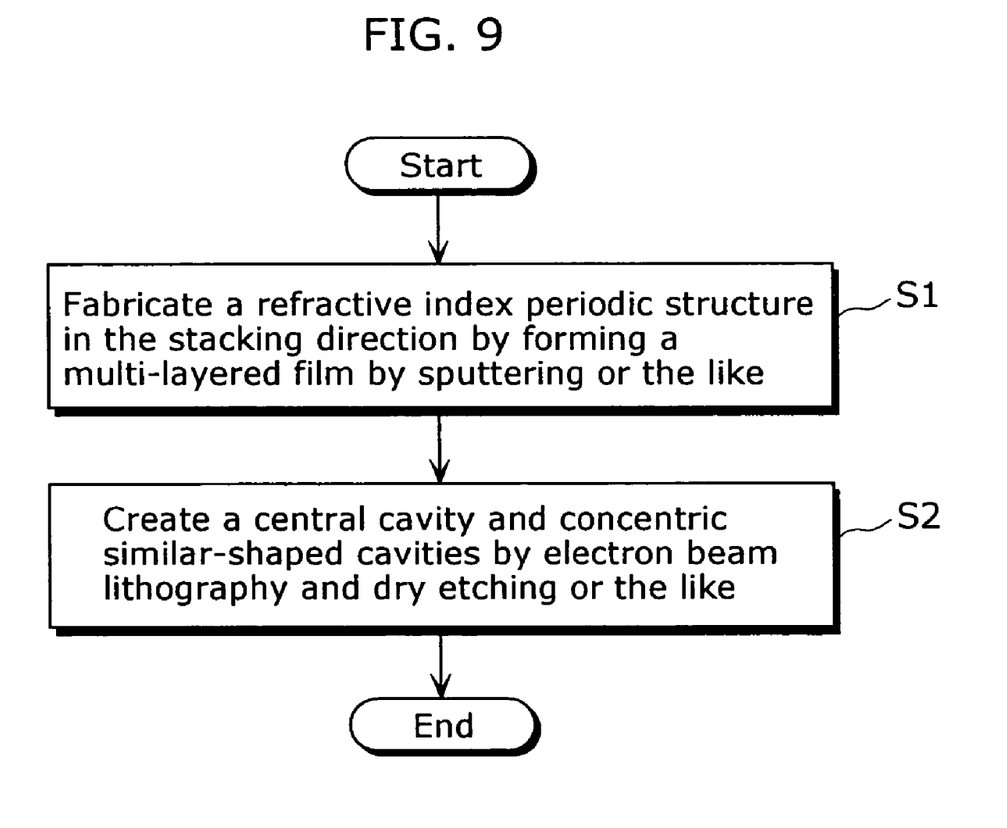
FIG. 9 is a flowchart showing a method for fabricating photonic crystals for solid-state imaging elements in the first embodiment of the present invention.

FIG. 9 is a flowchart showing a method for fabricating photonic crystals for the solid-state imaging elements 11a, 11b and 11c in the present embodiment. First, a periodic structure of refractive indices in the stacking direction is fabricated by forming multi-layered film by sputtering or the like (S1), a central cavity and concentric similar-shaped cavities are created by electron beam lithography, dry etching or the like (S2), and finally a tubular photonic crystals having a refractive index periodic structure in both the stacking direction and the in-plane direction, as shown in FIG. 2, are fabricated. As for an etching technique for realizing a deep and fine structure with a large aspect ratio as shown in FIG. 2, please see the following documents:

(1) T. Baba, et al., *Inductively Coupled Plasma (ICP) Etching*, 17 Journal of Lightwave Technology, 2113, 2120 (1999).

(2) T. Tada, et al., *Electron Cyclotron Resonance (ECR) Etching*, 18 Japanese Journal of Applied Physics, 7253, 7256 (1999).

(3) T. Saitoh, et al., *Anode-coupled Reactive Ion Etching (RIE)*, 39 Japanese Journal of Applied Physics, 6259, 6263 (2000).

As described above, since the solid-state imaging element in the present embodiment makes light condensing and color separation using only an optical element made of a photonic crystal, there occurs no reflection loss nor coupling loss due to its structure including a plurality of elements, which are the conventional problems. In addition, the present solid-state imaging element does not need a color filter. Therefore, it is possible to realize a miniature solid-state imaging element with extremely low loss and effective light condensing.

Note that in the present embodiment, the concentric pattern in the in-plane direction is a circle, regular hexagon or square, but other polygons may be used.

Second Embodiment

Next, a solid-state imaging element in the second embodiment will be explained. This solid-state imaging element is different from that in the first embodiment in the structure of a photonic crystal and the method for fabricating it.

Figure 10:
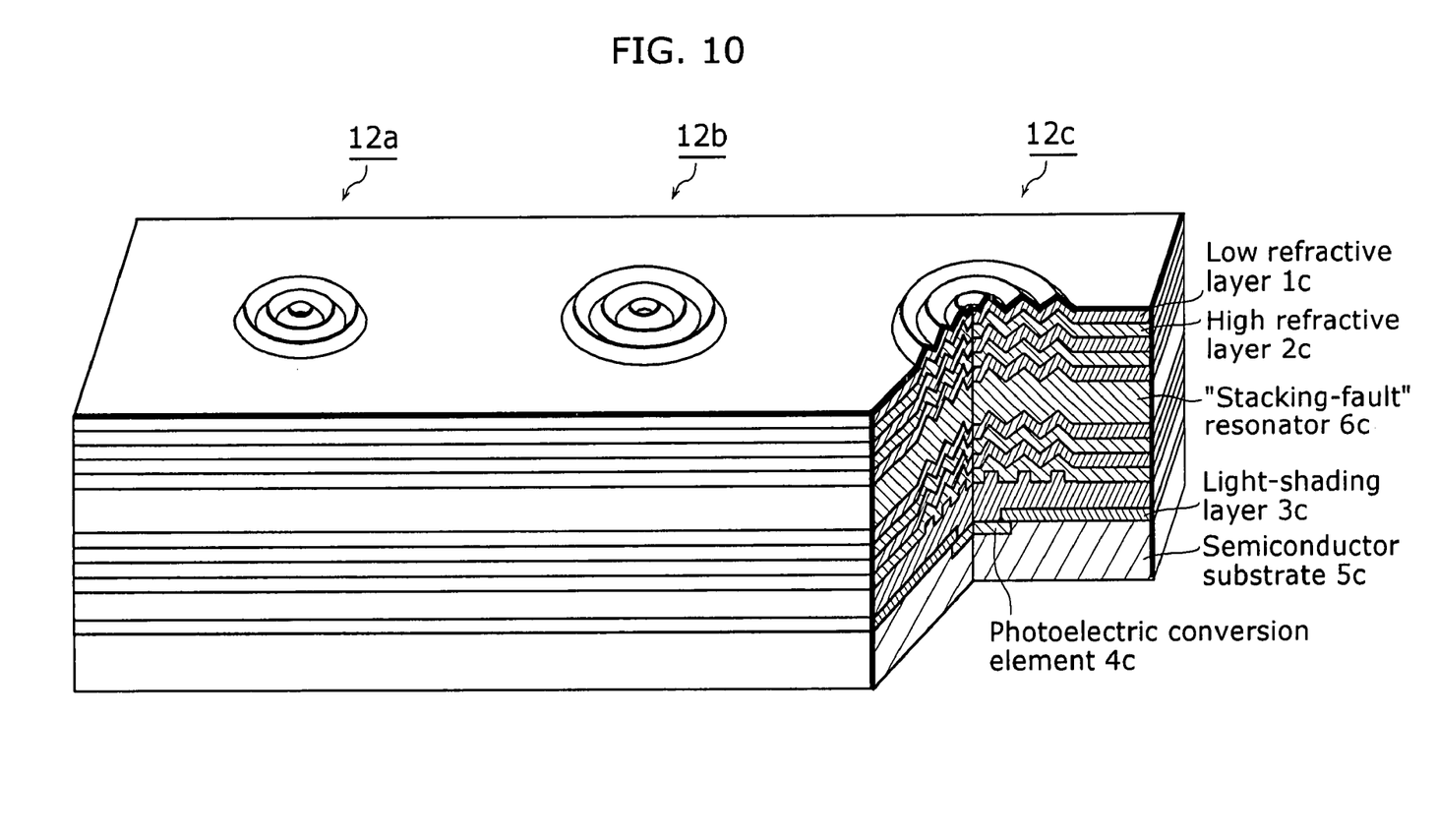
FIG. 10 is an external view of a set of solid-state imaging elements in a second embodiment of the present invention.

FIG. 10 is an external view of solid-state imaging elements 12a, 12b and 12c in the present embodiment. For example, the structure of the solid-state imaging element 12c is as follows: a photoelectric conversion element 4c for converting incident light into signal charge is provided on the surface of a semiconductor substrate 5c; a light-shading layer 3c for cutting off the incident light from the side is provided along the side of the window upon the photoelectric conversion element 4c; and a photonic crystal to be described later, as an optical element, is provided on the light-shading layer 3c and the photoelectric conversion element 4c so that the center of the concentric pattern thereof is aligned with the center of the photoelectric conversion element 4c.

The photonic crystal has a periodic structure of refractive indices in the stacking direction, like a multi-layer filter. Like the solid-state imaging element in the first embodiment, the photonic crystal has an 11-layer structure as a whole. It includes low refractive layers 1c as the odd-numbered layers including the top layer and high refractive layers 2c as the even-numbered layers including the second layer from the top, which are stacked alternately. Note that the sixth layer from the top, which is made of the high refractive material, is the "stacking-fault" resonator 6c. The same materials as those in the first embodiment can be used for the low refractive layers 1c and the high refractive layers 2c. For example, when $SiO_2$ and $Ta_2O_5$ are used, the $SiO_2$ film thickness is 92 nm (where the bottom layer thickness is 200 nm), whereas the $Ta_2O_5$ film thickness is 60 nm (where the thickness of the "stacking-fault" resonator is 120 nm).

On the other hand, in the in-plane direction of the photonic crystal, each of the top layer through the tenth layer of the solid-state imaging element 12c has a refractive index periodic structure by having three concentric doughnut-shaped projections, with a cross-sectional profile being a series of triangles, that form concentric circles. The eleventh layer, namely, the bottom layer will be described later.

Figure 11:
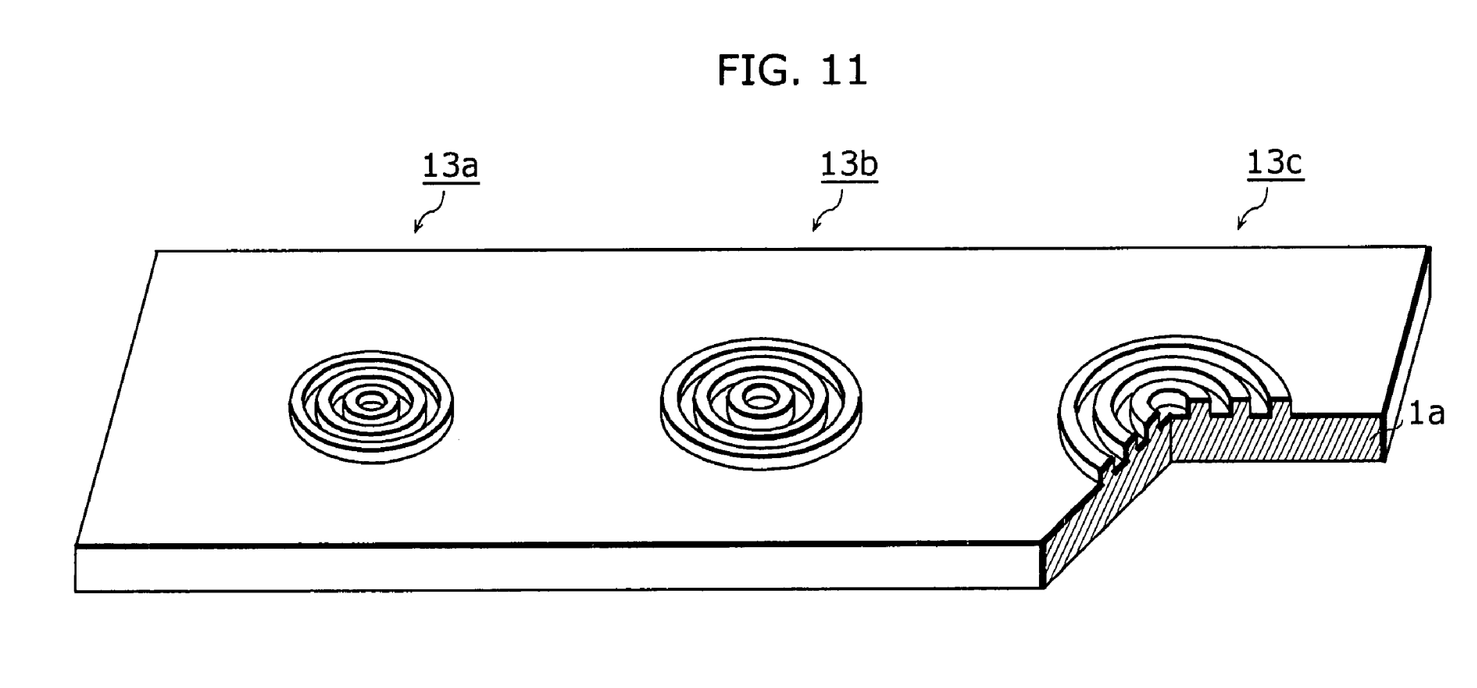
FIG. 11 is an external view of bases for photonic crystals in a set of solid-state imaging elements in the second embodiment of the present invention.

FIG. 11 is an external view of bases for fabricating photonic crystals for the solid-state imaging elements in the second embodiment of the present invention. Bases 13a, 13b and 13c are the bases for fabricating the photonic crystals of the solid-state imaging elements 12a, 12b and 12c as shown in FIG. 10 by autocloning. Namely, these bases are the bottom layers of the photonic crystals of the solid-state imaging elements 12a, 12b and 12c as shown in FIG. 10. On the layer of $SiO_2$ with the thickness of 200 nm, three projections with a height of 100 nm having a rectangular cross-sectional profile are provided concentrically. Both the widths of the projections and the pitches of the adjacent concentric circles are 80 nm and 160 nm for the solid-state imaging element 13a, 100 nm and 200 nm for 13b, and 120 nm and 240 nm for 13c, respectively. The respective diameters of the central openings are same as the pitches of the adjacent concentric circles.

The transmission wavelength of the photonic crystal is determined by the thicknesses and the refractive indices of the low refractive layers 1 and the high refractive layers 2 in the stacking direction. Various periods of concentric circles cause various effective refractive indices and, thus, cause transmission wavelengths to vary from element to element. As a result, the photonic crystals with various transmission wavelengths in the solid-state imaging elements 12a, 12b and 12c as shown in FIG. 10 allow separation of incident light into RGB colors (wavelength filtering function). In addition, the in-plane directional refractive index periodic structure of this photonic crystal brings about a light condensing function.

Figure 12:
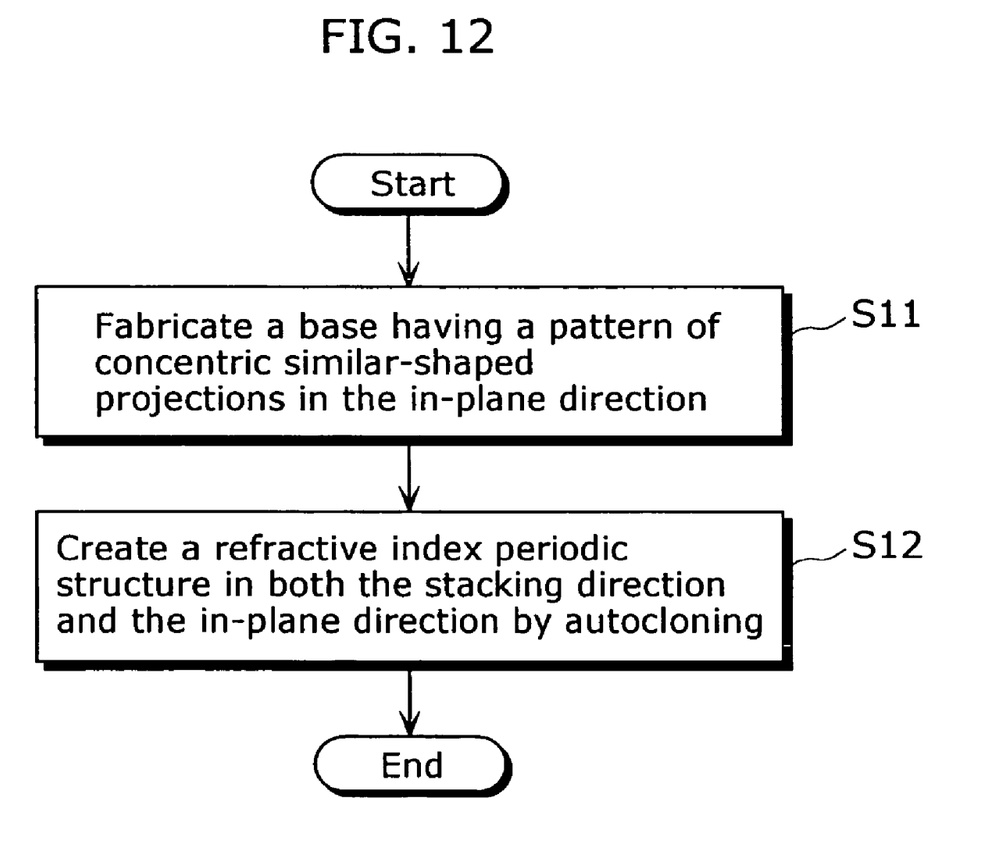
FIG. 12 is a flowchart showing a method for fabricating photonic crystals for solid-state imaging elements in the second embodiment of the present invention.

FIG. 12 is a flowchart showing a method for fabricating photonic crystals for solid-state imaging elements in the present embodiment. First, bases, as shown in FIG. 11, having a pattern of concentric similar-shaped projections in the in-plane direction are fabricated (S11), a refractive index periodic structure is created in both the in-plane direction and the stacking direction by stacking the high refractive material and the low refractive material alternately by autocloning (S12), and finally photonic crystals having a refractive index periodic structure in both the stacking direction and the in-plane direction, as shown in FIG. 10, are fabricated for the solid-state imaging elements 12a, 12b and 12c.

As described above, since the solid-state imaging element in the second embodiment makes light condensing and color separation using only an optical element made of a photonic crystal fabricated by autocloning, a color filter is not needed and there occurs no reflection loss nor coupling loss due to its structure including a plurality of elements. Therefore, it is possible to realize a miniature solid-state imaging element with extremely low loss and efficient light condensing. It is also possible to make a solid-state imaging element smaller in the in-plane directional size than the conventional one.

Note that in the present embodiment, the concentric pattern in the in-plane direction is a circle, but a regular hexagon, a square, or any other polygons may be used.

The present invention is not limited to the solid-state imaging elements in the above-mentioned embodiments. For example, in the first and second embodiments, the photonic crystal has a stacking structure of 11 layers, but it may have more layers. In addition, the concentric periodic structure in the in-plane direction has a pattern including 3 periods of similar shapes and a regular pitch in the first and second embodiments, but it may include 4 or more periods, and may have irregular pitches. Furthermore, the method for fabricating the photonic crystal is not limited to multi-layer fabrication technology, lithography, etching or autocloning; any other methods may be used.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A solid-state imaging element comprising a photoelectric conversion element and an optical element which is formed on said photoelectric conversion element, wherein;

a center of said optical element is aligned with a center of said photoelectric conversion element, and said optical element has a refractive index periodic structure for a predetermined refractive index, said refractive index periodic structure being made up of at least two types of light-transparent materials with different refractive indices which are stacked in layers, and said refractive index periodic structure has a periodic structure along a stacking direction of the layers of light-transparent materials and a periodic structure, along an in-plane direction, defined by concentric similar shapes, wherein;

said concentric similar shapes are disposed in a horizontal plane, and said optical element has a tube-shape which is formed by extending said concentric similar shapes in a direction vertical to the in-plane direction, wherein:

said optical element has a central opening and one or more concentric similar-shaped openings disposed in the horizontal plane, the opening being defined by said concentric similar shapes, and said optical element has a central cavity and one or more concentric cavities around the central cavity, which are formed by extending said central opening and said one or more concentric similar-shaped openings in a direction vertical to the in-plane direction.

2. The solid-state imaging element according to claim 1, wherein a ratio of a width of an opening to a pitch increases as the opening is more distant from a center of said concentric similar shapes, the pitch being a distance between the opening and an adjacent outer opening.

3. The solid-state imaging element according to claim 2, wherein the pitch is constant and the width of the opening increases as the opening is more distant from the center of said concentric similar shapes.

4. The solid-state imaging element according to claim 2, wherein the width is constant and the pitch decreases as the opening is more distant from the center of said concentric similar shapes.

5. The solid-state imaging element according to claim 2, wherein the pitch decreases as the opening is more distant from the center of said concentric similar shapes, and the width of the opening increases as said opening is more distant from the center of said concentric similar shapes.

6. A method for fabricating a solid-state imaging device comprising a plurality of solid-state imaging elements which are arranged in a two-dimensional plane, wherein each of the solid-state imaging elements comprises a photoelectric conversion element and an optical element which is formed on the photoelectric conversion element, wherein:

a center of the optical element is aligned with a center of the photoelectric conversion element, and the optical element has a refractive index periodic structure for a predetermined refractive index, the refractive index periodic structure being made up of at least two types of light-transparent materials with different refractive indices which are stacked in layers, and the refractive index periodic structure has a periodic structure along a stacking direction of the layers of light-transparent materials and a periodic structures along an in-plane direction, defined by concentric similar shapes, said method comprising:

forming the optical element in a tube shape by creating, using lithography and etching, a central cavity and one or more concentric cavities around the central cavity inside the optical element by extending, in a direction vertical to the in-plane direction, a central opening and one or more concentric similar-shaped openings, the openings being defined by the concentric similar shapes and disposed in a horizontal plane; and aligning the center of the optical element with the center of the photoelectric conversion element.

7. The method for fabricating a solid-state imaging device according to claim 6, wherein the optical element is a photonic crystal.

* * * * *